(12) United States Patent
Mine et al.

(10) Patent No.: US 6,461,883 B1
(45) Date of Patent: Oct. 8, 2002

(54) METHOD FOR MANUFACTURING LED ARRAY HEAD AND LED ARRAY HEAD PREPARED BY USING THE SAME

(75) Inventors: Ryuta Mine; Toshiyuki Sekiya, both of Mishima; Mitsuo Shiraishi, Shizuoka-ken, all of (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/676,946

(22) Filed: Oct. 2, 2000

(30) Foreign Application Priority Data

Oct. 4, 1999 (JP) .......................................... 11-283132

(51) Int. Cl.[7] .............................................. H01L 21/00
(52) U.S. Cl. ......................................... 438/22; 438/119
(58) Field of Search ............................. 438/22, 26, 28, 438/48, 51, 64, 106, 118, 119

(56) References Cited

U.S. PATENT DOCUMENTS

| | | | |
|---|---|---|---|
| 4,896,168 A | * | 1/1990 | Newman et al. ............ 346/107 |
| 5,177,405 A | | 1/1993 | Kusuda et al. ........... 315/169.1 |
| 5,252,820 A | * | 10/1993 | Sawase et al. ................ 257/99 |
| 5,451,977 A | | 9/1995 | Kusuda et al. ................ 345/44 |
| 6,087,680 A | * | 7/2000 | Gramann et al. ............. 257/91 |

FOREIGN PATENT DOCUMENTS

| | | |
|---|---|---|
| JP | 1-238962 | 9/1989 |
| JP | 2-208067 | 8/1990 |
| JP | 2-212170 | 8/1990 |
| JP | 3-20457 | 1/1991 |
| JP | 3-194978 | 8/1991 |
| JP | 4-5872 | 1/1992 |
| JP | 4-23367 | 1/1992 |
| JP | 4-296579 | 10/1992 |
| JP | 5-84971 | 4/1993 |

OTHER PUBLICATIONS

Y. Kusuda, et al., "Proposal of Integrated Light Emitting Device Array with Driving Circuit for Photo–printer", A–17, pp. 61–64 (1991).

Y. Kusada, et al., "Proposal of the Self–Scanning Light Emitting Device Using PNPN–Thyristor", OQE 89–141, pp. 43–47 (Mar. 5, 1990).

* cited by examiner

Primary Examiner—David Nelms
Assistant Examiner—David Nhu
(74) Attorney, Agent, or Firm—Fitzpatrick, Cella, Harper & Scinto (57) ABSTRACT

An LED array head for an electrophotographic system includes a base plate mounting thereon a number of linearly arranged LED chips and a support member holding the base plate. The base plate and the support member are bonded together by means of a principal adhesive agent which is elastic after hardening such as a silicone type and an auxiliary adhesive agent which hardens more quickly and is less elastic after hardening than the principal adhesive agent. An ultraviolet ray setting type adhesive agent is preferably used as the auxiliary adhesive agent. Assembling steps of such LED array heads can proceed without waiting for hardening of the principal adhesive agent.

10 Claims, 6 Drawing Sheets

METHOD FOR MANUFACTURING LED ARRAY HEAD AND LED ARRAY HEAD PREPARED BY USING THE SAME

BACKGROUND OF THE INVENTION

1. Field of the Invention

This invention relates to a method for manufacturing a LED array head to be used as recording light-emitting elements for forming a permanent visible image on a recording medium by means of an electrophotographic recording system and also to a LED array head prepared by using such a method.

2. Related Background Art

Self-scan type LED arrays (to be referred to as "SLEDs" hereinafter) are described in Japanese Patent Application Laid-Open Nos. 1-238962, 2-208067, 2-212170, 3-20457, 3-194978, 4-5872, 4-23367, 4-296579 and 5-84971, "Proposal of a Light Emitting Element Array to be used for an Optical Printer Integratedly Comprising a Drive Circuit" (Japan Hard Copy '91 (A-17)) and "Self-Scan Type Light Emitting Element (SLED) Using a PNPN Thyristor Structure" (The Institute of Electronics, Information and Communication Engineers (3. 5. '90)). Such self-scan LED arrays are attracting attention as light-emitting elements to be used for recording purposes.

Figure 2:
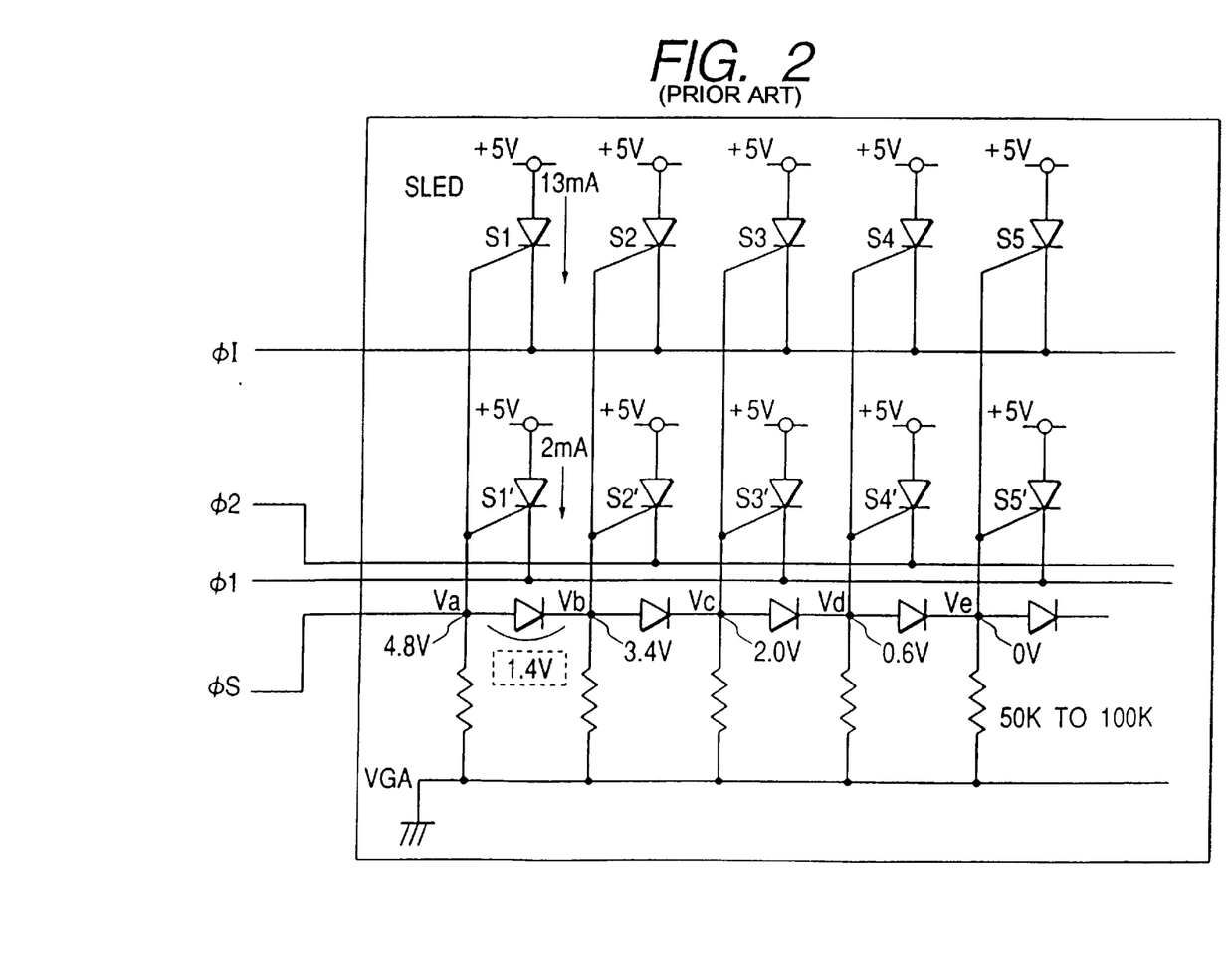
FIG. 2 is an equivalent circuit diagram of a SLED of the embodiment and a conventional SLED array head, illustrating its basic configuration.
Figure 3:
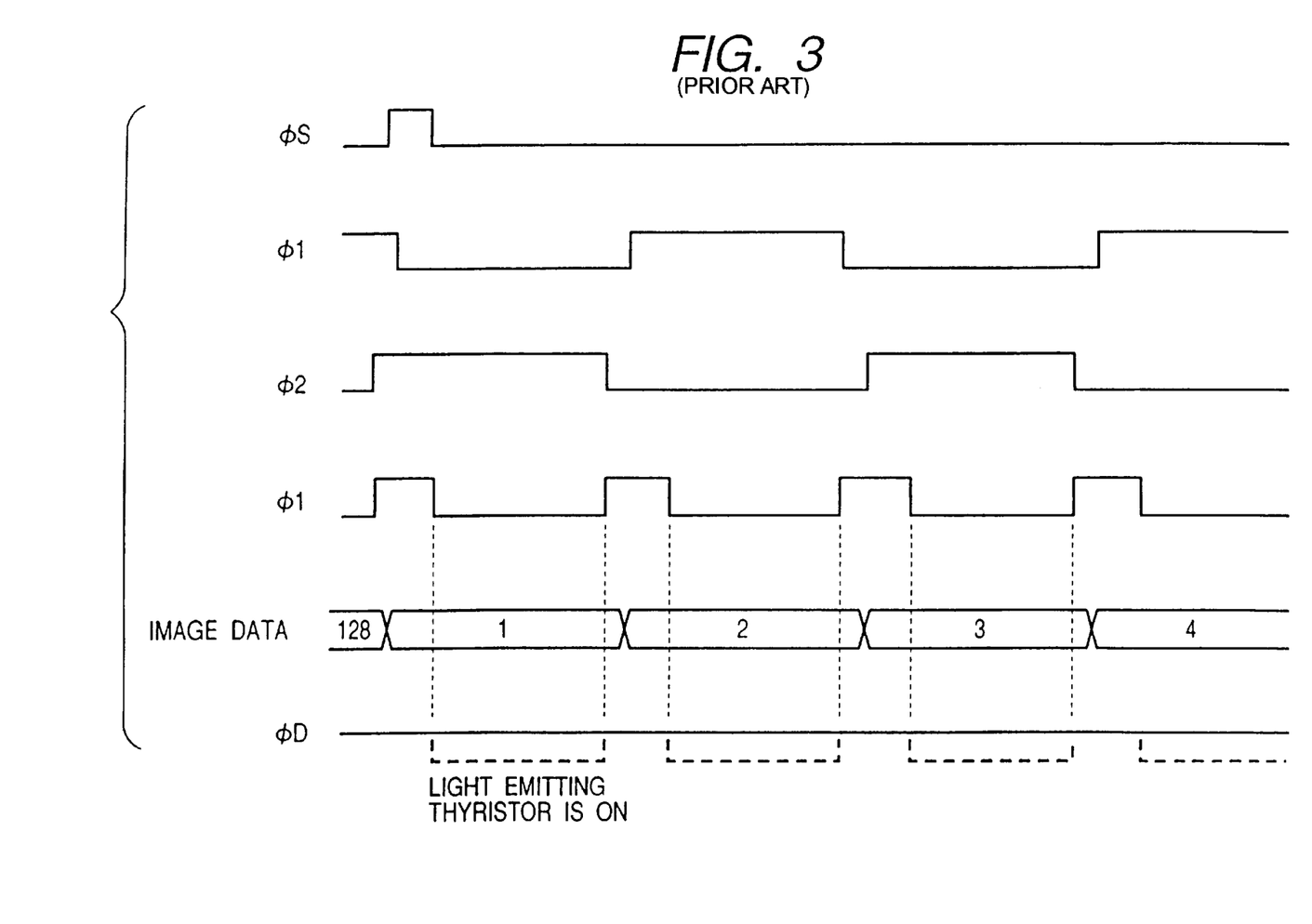
FIG. 3 is a control timing chart for controlling the SLED of FIG. 2.

FIG. 2 of the accompanying drawings is a circuit diagram of a known SLED. FIG. 3 is a timing chart of control signals to be used for turning on all the elements. Now, the configuration and the method of driving the SLED will be described by referring to FIGS. 2 and 3.

Referring firstly to FIG. 2, VGA represents the ground voltage of the SLED and is connected to a plurality of diodes by way of respective resistors, which diodes are cascaded to start pulse $\phi$S. The SLED comprises transfer thyristors S1' to S5' arranged in array and light-emitting thyristors S1 to S5 also arranged in array and the gates of the thyristors of each column of the two rows are mutually connected. The gates of the two thyristors of the first column are connected to the signal input section for receiving start pulse $\phi$S, while the gates of the two thyristors of the second column are connected to the cathode of the diode whose anode is connected to the input terminal for receiving start pulse $\phi$S. This arrangement is repeated for the third and fourth columns and so on.

Now, the transfer aspect and the light emission aspect of the SLED will be described by referring to the timing chart of FIG. 3. A transfer operation of the SLED starts when the start pulse $\phi$S is shifted from 0V to 5V. When the start pulse $\phi$S is at 5V and the forward voltage fall of a diode is 1.4V, Va=5V, Vb=3.6V, Vc=2.2V and 0V from Vd onward, while the gate signals of the transfer thyristors S1' and S2' are respectively at 5V and 3.7V. When shift pulse $\phi$1 is shifted from 5V to 0V under this condition, the transfer thyristor S1' shows 5V at the anode, 0V at the cathode and 3.7V at the gate so that the transfer thyristor S1' becomes ON because the requirements for turning ON the transfer thyristor S1' are satisfied. However, if start pulse $\phi$S is shifted to 0V under this condition, Va∝5V as the transfer thyristor S1' is ON. This is because $\phi$S is being applied by way of a resistor and the anode and the gate show a substantially equal potential when the thyristor becomes ON. As a result, the requirements for keeping the first transfer thyristor S1' ON are satisfied if start pulse $\phi$S becomes equal to 0V so that the first shift operation will be completed. If the light-emitting thyristor drive clock $\phi$I signal is shifted from 5V to 0V under this condition, the condition under which the transfer thyristor is turned ON is regained so that the light-emitting thyristor S1 becomes ON to turn on the first LED. As the first LED is turned on, when the light-emitting thyristor drive clock $\phi$I is made to return to 5V, the anode and the cathode of the light-emitting thyristor S1 no longer shows any potential difference so that the lowest holding current of the thyristor no longer flows and the light-emitting thyristor S1 becomes OFF.

Now, the transfer of the ON condition from the transfer thyristor S1' to the transfer thyristor S2' will be discussed below. If the light-emitting thyristor S1 becomes OFF, shift pulse $\phi$1 remains to be 0V and hence the transfer thyristor S1' is held ON so that the gate voltage of the transfer thyristor S1' is Va∝5V and that of the transfer thyristor S2' is Vb=3.7V. When shift pulse $\phi$2 is shifted from 5V to 0V under this condition, the transfer thyristor S2' shows 5V at the anode, 0V at the cathode and 3.7V at the gate so that the transfer thyristor S2' becomes ON. The transfer thyristor S1' is turned OFF just as the light-emitting thyristor S1 is turned OFF by shifting shift pulse $\phi$1 from 0V to 5V after turning ON the transfer thyristor S2'. Thus, the ON condition is shifted from the transfer thyristor S1' to the transfer thyristor S2'. Then, the light-emitting thyristor S2 becomes ON as the potential of the light-emitting thyristor drive clock $\phi$I is shifted from 5V to 0V.

The reason why only the light-emitting thyristor that corresponds to the ON transfer thyristor is that the requirements for turning ON a thyristor are not met except the one adjacent to an ON thyristor because the gate voltage of a transfer thyristor that is not ON is equal to 0V. The adjacent thyristor also cannot be turned ON because the potential of the light-emitting thyristor drive clock $\phi$I becomes equal to 3.4V (by which the forward voltage of the light-emitting thyristor falls) as the light-emitting thyristor is turned ON and hence the gate and the cathode of the adjacent thyristor do not show any potential difference.

While the light-emitting thyristor becomes ON and emits light by making the potential of the light emitting thyristor drive clock equal to 0V in the above description, it is necessary to control the light emitting thyristor so as to make it actually emit light with that timing or not according to the applied data in an actual printing operation. In FIG. 3, image data and $\phi$D represents a control signal to be used for this purpose. The logical OR of $\phi$I and the image signal is externally determined for the $\phi$I terminal of the SLED and the potential of the $\phi$I terminal of the SLED is actually made equal to 0V to make the corresponding light emitting thyristor emit light only when the image data is at 0V, while the potential of the $\phi$I terminal of the SLED remains equal to 5V and the corresponding light emitting thyristor does not emit light when the image data is at 5V.

A LED array chip having a configuration as described above may comprise, for instance, 128 light emitting thyristors, which are sequentially controlled and selectively turned ON by means of the corresponding transfer thyristors.

Figure 4:
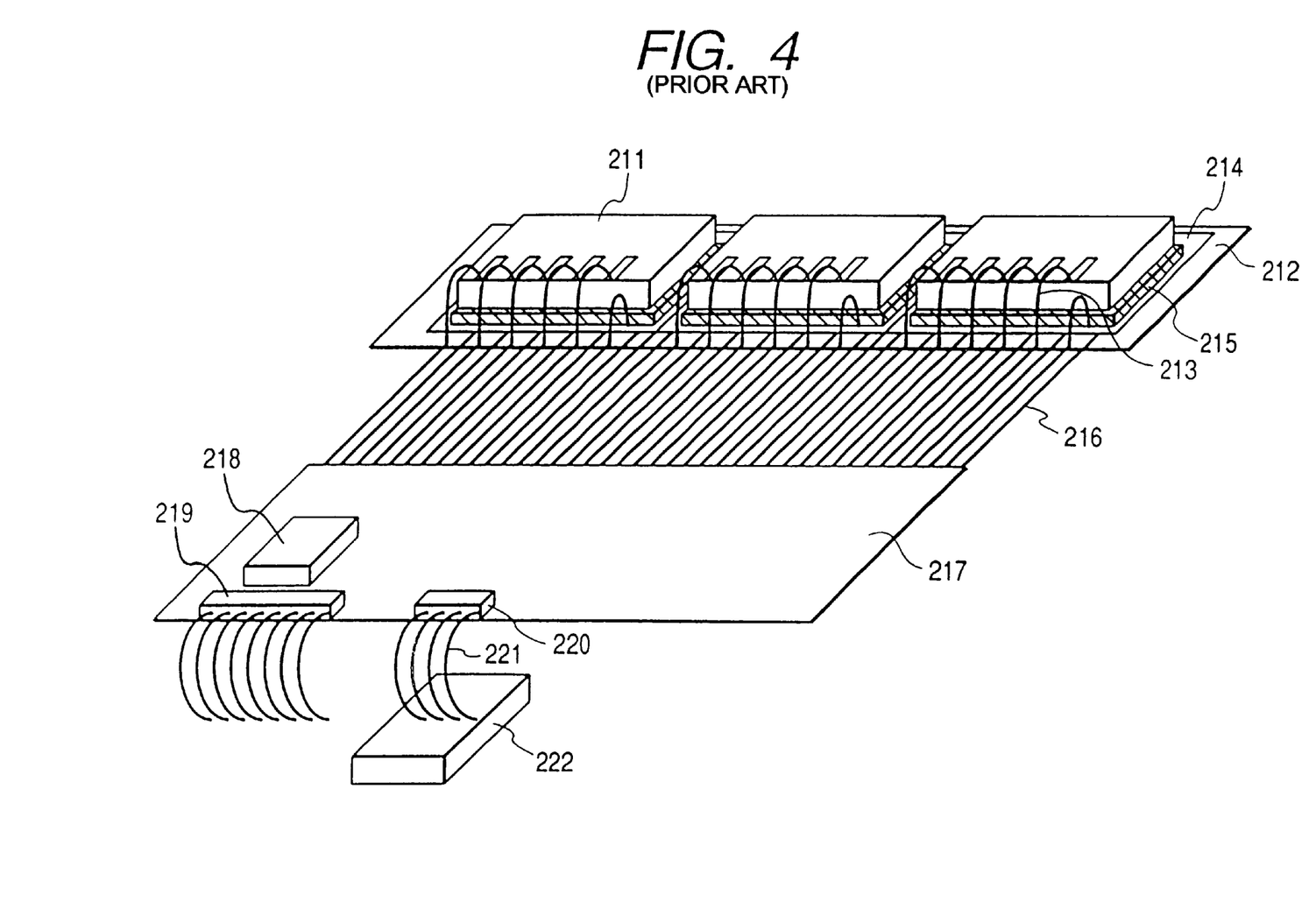
FIG. 4 is a schematic perspective view of the electric unit of a SLED array head.

FIG. 4 of the accompanying drawings is a schematic perspective view of a SLED array head, illustrating its configuration.

Referring to FIG. 4, the SLED array head comprises SLED semiconductor chips 211, a base plate 212 which is made of a glass epoxy material or a ceramic material that may be used for printed-wiring boards and carries thereon the SLED semiconductor chips, a signal connector 219 for receiving external control signals and power supplied from an external power source, a power supply connector 220 for receiving power for feeding the array head, a supply circuit 222, a supply cable 221 connecting driver substrate 217 and the supply circuit 222, a lighting control circuit (driver IC) 218 for receiving external control signals and generating lighting control signals for the SLED semiconductor chips 211, bonding wires for connecting output signals φ1, φ2, φS, φI and negative electrode side power input (GND in this example) to the SLED semiconductor chips, a driver substrate 217 carrying thereon the lighting control circuit (driver IC) 218, the signal connector 219 and the power supply connector 220 and a flexible cable 216 connecting the driver substrate and the base plate.

The SLED array head further comprises a positive electrode side power supply wire pattern 214 (+5V in this example) arranged on the base plate 212 and silver paste 215 for electrically connecting the positive electrode side power supply wire pattern 214 arranged on the base plate 212 and the rear side electrodes of the SLED semiconductor chips 211 and firmly anchoring the SLED semiconductor chips 211. Thus, the above electric components are unitized.

The SLED array head comprising the above electric unit is adapted to be used as an optical writing device of an image forming apparatus that comprises an image reading section including a CCD sensor and a printing section for electrophotographically forming images according to the image data sent from the image reading section.

More specifically, a photosensitive drum is primarily charged by means of a charger and an electrostatic latent image is formed on the photosensitive drum according to the image data by means of the SLED array head. Then, the electrostatic latent image is developed to produce a toner image by means of a developing unit and the toner image is transferred onto a recording medium by means of a transfer unit.

The SLED array head is placed in position by fitting the electric unit onto an aluminum support member that can be arranged horizontally highly accurately and machined easily.

Figure 5:
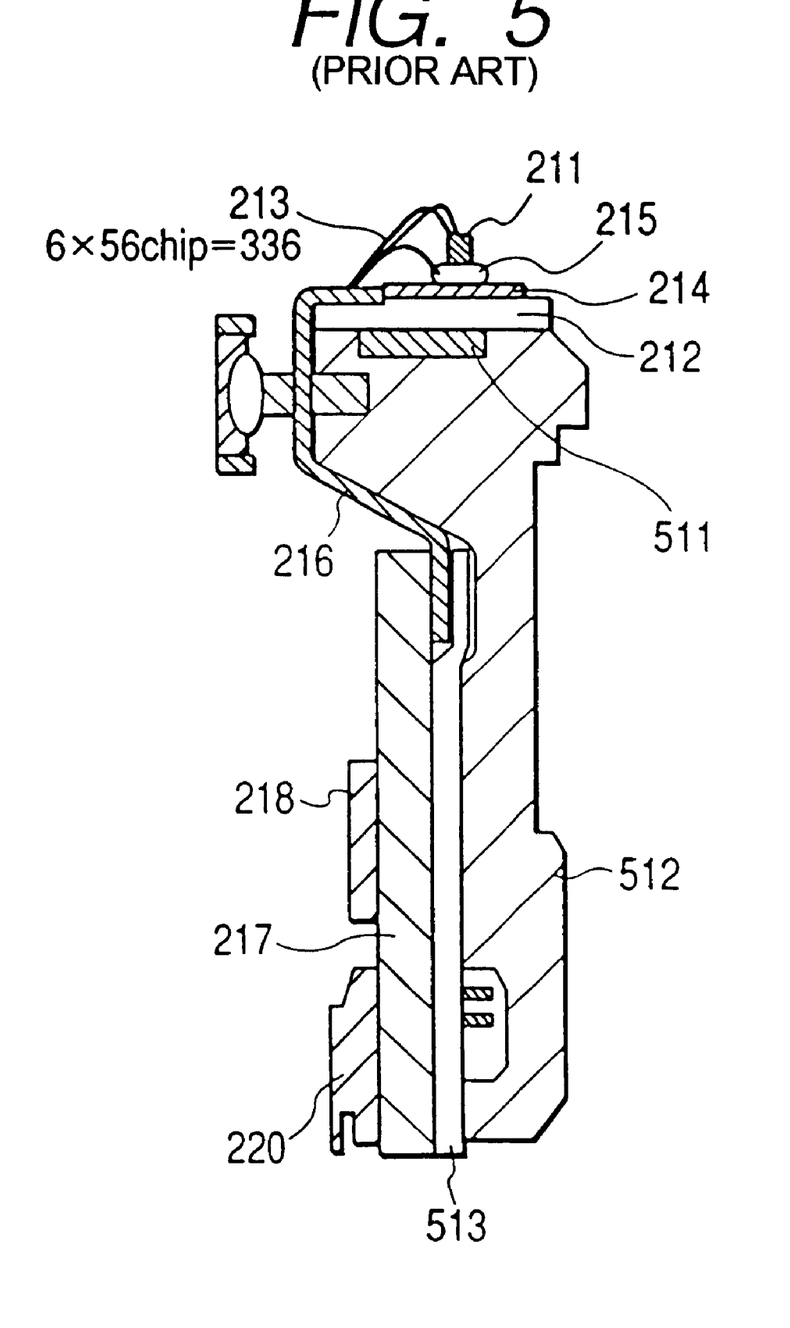
FIG. 5 is a schematic cross sectional view of a SLED array head to which the present invention is applicable.

FIG. 5 of the accompanying drawings is a schematic cross sectional view of the electric unit of the SLED array head that is fitted to the aluminum support member. In FIG. 5, the same components as those of FIG. 4 are denoted respectively by the same reference symbols, while the aluminum support member is denoted by reference number 512.

In FIG. 5, reference numeral 511 denotes the silicone adhesive that is filled in a slit cut into the aluminum support member 512 from above in order to bond the base plate 212 and the aluminum support member 512 to each other. Since the aluminum support member 512 and the base plate 212 show different expansion coefficients, the base plate 212 can become warped to damage the linear arrangement of the SLED semiconductor chips 211 on the base plate 212 if the aluminum support member and the ceramic base plate are completely rigidly secured to each other by means of an adhesive agent that hardens and the aluminum support member 512 and the base plate 212 expand with different expansion coefficients as a result of temperature change in the ambient air.

Then, in the worst case, the base plate 212 can become cracked. If the linear arrangement of the SLED semiconductor chips 211 is damaged, the scanning lines of the SLED array head can become displaced so that the electrostatic latent image formed on the photosensitive drum would not accurately reflect the image data applied thereto. Normally, the displacement of the SLED semiconductor chips 211 has to be less than 50 μm. Therefore, silicone adhesive that is a resilient adhesive agent is used to bond the aluminum support member 512 and the base plate 212 to each other in order to absorb the difference in the expansion coefficient between the aluminum support member 512 and the base plate 212.

In other words, the silicone adhesive 511 secures the linear arrangement of the SLED semiconductor chips 211.

Since the SLED semiconductor chips 211 emit less light as its temperatures rises, the aluminum support member 512 is used to draw out the heat generated in them. Then, the silicone adhesive 511 that is thermally highly conductive makes the heat generated in the base plate 212 to be also easily drawn to the aluminum support member 512.

Figure 6A:
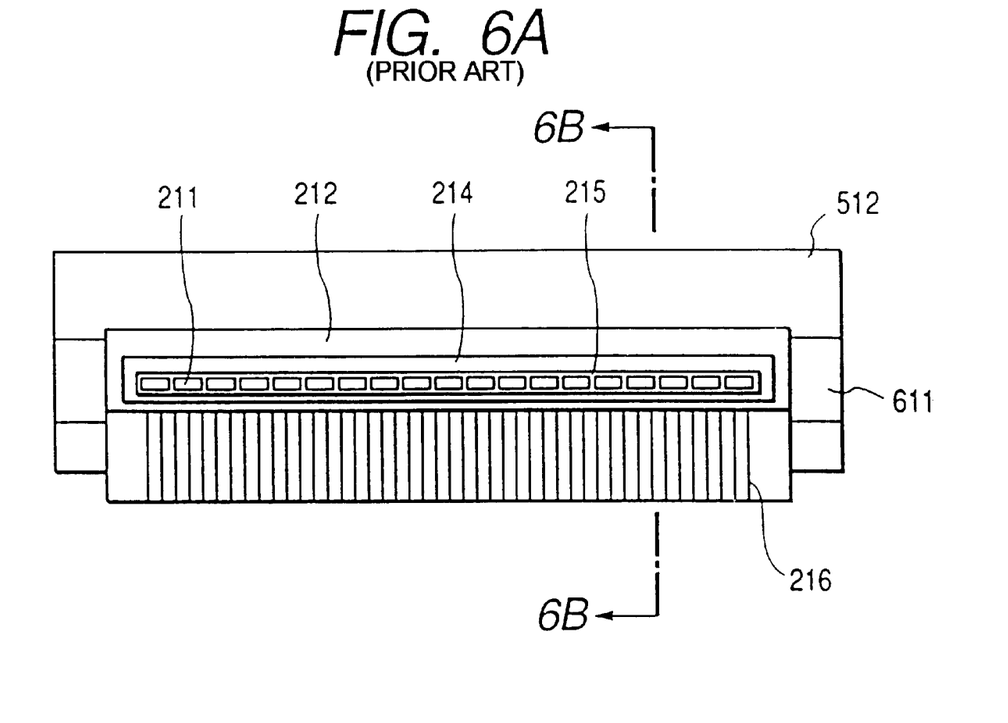
FIGS. 6A and 6B are respectively a schematic plan view and a schematic cross sectional view of a part of the base plate and a part of the aluminum support member that are used to bond them together in a known SLED array head.
Figure 6B:
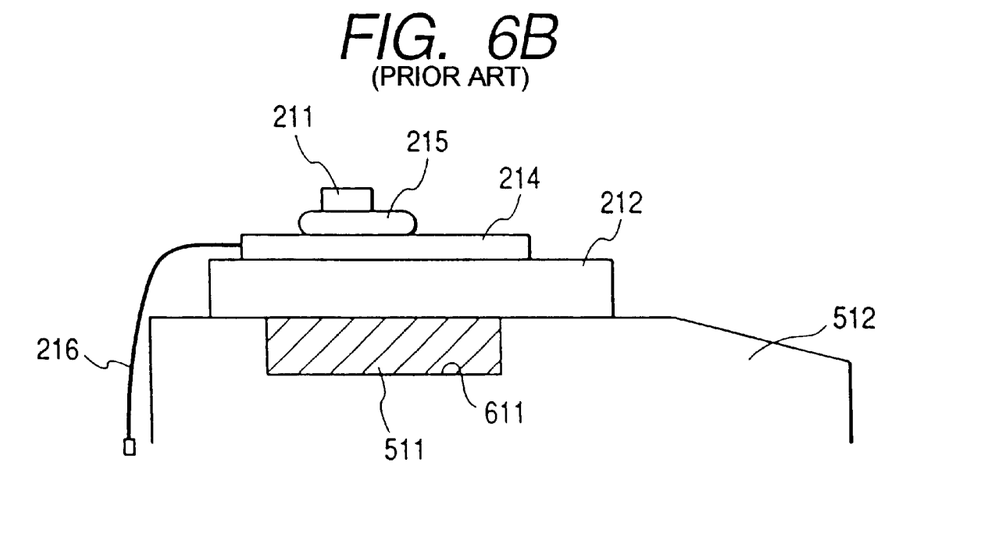

FIGS. 6A and 6B of the accompanying drawings show a part of the base plate and a part of the aluminum support member that are used to bond them together. FIG. 6A is a schematic plan view of the SLED semiconductor chips 211 and some other components and FIG. 6B is a schematic cross sectional view taken along line 6B—6B in FIG. 6A. Referring to FIGS. 6A and 6B, slit 611 is filled with the silicone adhesive 511 that bond the base plate 212 and the aluminum support member 512 to each other.

However, silicone adhesive normally requires more than a day for hardening. This means that a SLED array head has to wait a full day on or off the assembly line in a state where the base plate 212 carrying the SLED semiconductor chips 211 is bonded to the aluminum support member 512 before it proceeds to the next step of assembling operation. This is highly inefficient from the assembly point of view and cumbersome because a large space has to be provided for drying. In other words, this problem is a bottle neck for mass production of SLED array heads.

SUMMARY OF THE INVENTION

In view of the above identified problem, it is therefore an object of the present invention to provide a method for manufacturing a LED array head that can improve the assembling efficiency and also a LED array head that is manufactured by such a method.

Another object of the present invention is to provide a LED array head whose scanning lines are minimally warped when forming a latent image by exposing a photosensitive drum to scanning light beams.

According to the invention, the above objects and other objects are achieved by providing a method for manufacturing a LED array head comprising:

a step of applying a first adhesive agent showing elasticity after hardening in order to bond a base plate for mounting LED chips and a support member for holding the base plate to each other; and a step of applying a second adhesive agent showing a hardening rate higher than and an elasticity after hardening lower than the first adhesive agent before the first adhesive agent hardens.

In another aspect of the invention, there is provided a LED array head comprising:

a base plate for mounting LED chips; and a support member for supporting said base plate;

said base plate being rigidly secured to said support member by means of a first adhesive agent showing elasticity and a second adhesive agent showing an elasticity lower than the first adhesive agent.

Now, the present invention will be described in greater detail by referring to the accompanying drawings.

DESCRIPTION OF THE PREFERRED EMBODIMENT

In the following description of an embodiment of the invention, it should be noted that SLED semiconductor chips are used for LEDs and the operation of the head is the same as described in the Related Background Art section.

Figure 1A:
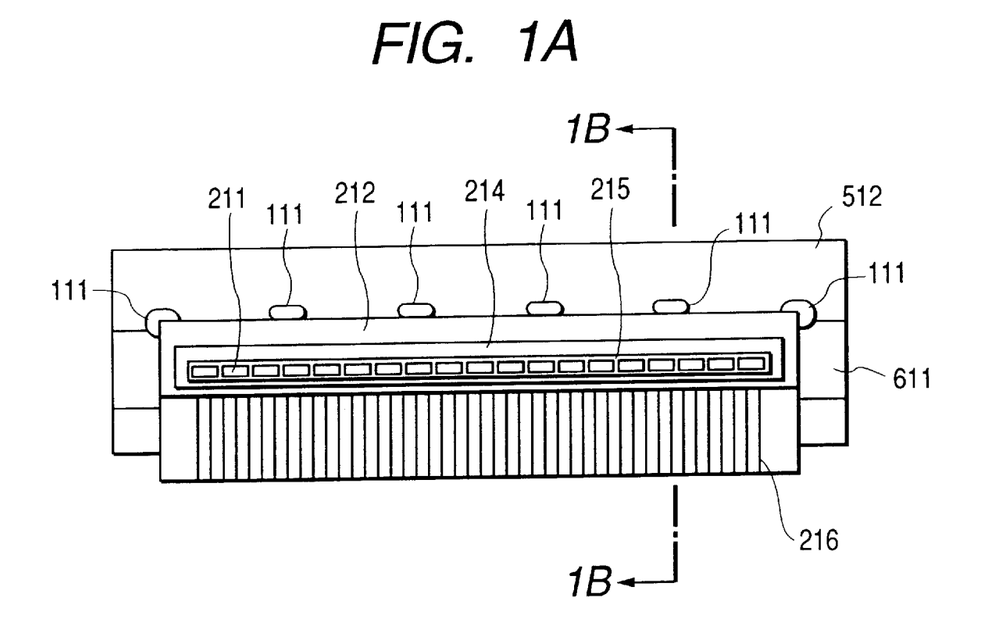
FIGS. 1A and 1B are respectively a schematic plan view and a schematic cross sectional view of a part of the base plate and a part of the aluminum support member that are used to bond them together in an embodiment of SLED array head according to the invention.
Figure 1B:
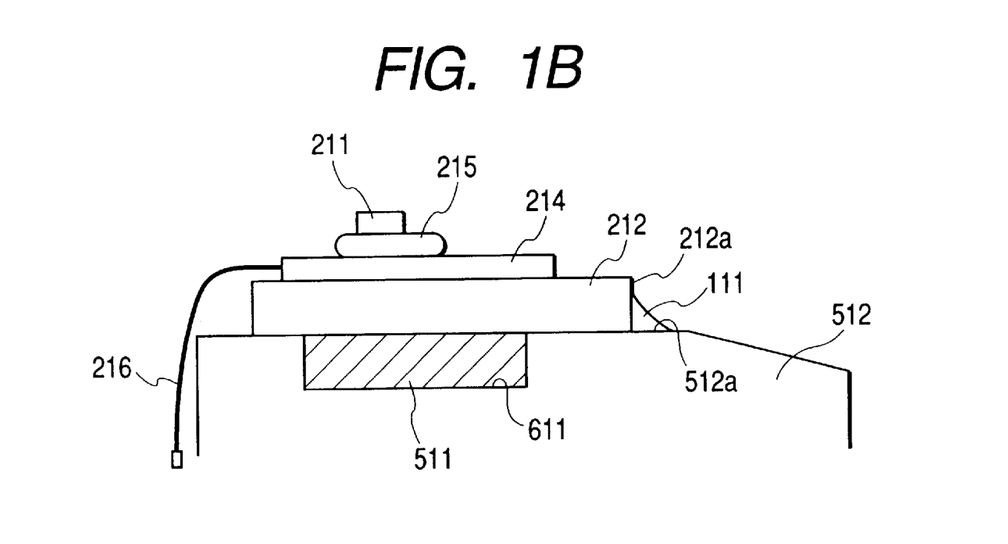

FIG. 1A is a schematic plan view of the embodiment showing a base plate 212 carrying thereon SLED semiconductor chips 211 and an aluminum support member 512 that are bonded to each other. FIG. 1B is a schematic cross sectional view taken along line 1B—1B in FIG. 1A. As pointed out earlier, the base plate 212 is typically made of a ceramic material or glass cloth impregnated with epoxy resin that is commonly used for printed-wiring boards.

This embodiment is characterized in that the base plate 212 and the aluminum support member 512 are bonded to each other by means of a silicone adhesive agent 511 that is an elastic adhesive agent and being popularly used for conventional LED array heads and also an auxiliary adhesive agent 111 that hardens more quickly than the silicone adhesive agent 511 to become less elastic and is of the ultraviolet ray setting type. An ultraviolet ray setting type adhesive agent is a fast adhesive in the sense that it hardens quickly when irradiated with ultraviolet rays.

The slit 611 cut into the aluminum support member 512 from above is filled with the silicone adhesive agent 511 that bonds the base plate 212 and the aluminum support member 512 to each other.

When bonding the base plate 212 and the aluminum support member 512 to each other by means of the silicone adhesive agent 511, the ultraviolet ray setting type adhesive agent 111 is used as auxiliary agent for bonding the base plate 212 and the aluminum support member 512 together.

The ultraviolet ray setting type adhesive agent 111 is applied to positions shown in FIGS. 1A and 1B. More specifically, the ultraviolet ray setting type adhesive agent 111 is applied discretely to the angle formed by the surface 512a of the aluminum support member 512 that faces the base plate 212 and a lateral surface 212a of the base plate 212 at intervals between several centimeters and 10 centimeters.

In the instance of FIGS. 1A and 1B, if the lateral surface of the base plate 212 is about 31 cm long, the ultraviolet ray setting type adhesive agent 111 is applied as auxiliary agent to a total of six positions including the opposite ends of the lateral surface at regular intervals of about 6.2 cm.

In the use of this auxiliary bonding technique, the ultraviolet ray setting type adhesive agent 111 hardens before the silicone adhesive agent 511 becomes hard so that any possible displacements and warps of the base plate 212 in the subsequent steps of assembling the SLED array head are eliminated and therefore the assembling operation can be continued without halt.

While the ultraviolet ray setting type adhesive agent is removed after the completion of the operation of assembling the SLED array head in this embodiment, it may be left in place if a silicone adhesive agent is used in order to enhance the adhesion of the aluminum support member and the base plate and realize a good conduction of heat from the base plate to the aluminum support member.

If an instant adhesive agent that may be of the cyanoacrylate type is used in place of the ultraviolet ray setting type adhesive agent, gas can be generated in any of the subsequent steps to adversely affect some of the optical components of the SLED array head. This is the reason why an ultraviolet ray setting type adhesive agent is used as quickly hardening adhesive for the purpose of the invention because it does not generate any gas.

While the present invention is described in terms of a SLED array head that uses SLED semiconductor chips for LEDs, the present invention is by no means limited thereto and can be used for manufacturing any LED array head comprising LEDs to fully exploit the advantages of the present invention.

As described above in detail, according to the invention, an ultraviolet ray setting type adhesive agent (an adhesive agent that hardens quickly when irradiated with ultraviolet rays) is used as an auxiliary agent when bonding the aluminum support member and the base plate to each other by means of a silicone adhesive agent. As a result, the operation of assembling a SLED array head can proceed to the next step without waiting for the hardening of the silicone adhesive agent so that no space is required for temporarily storing the SLED array head and the efficiency of the assembling operation can be greatly improved.

What is claimed is:

1. A method for manufacturing an LED array head, comprising the steps of:
   preparing an LED base plate having LEDs and a support member for holding the LED base plate;
   applying a first adhesive agent showing elasticity after hardening between the LED base plate and the support member in order to bond them to each other;
   applying a second adhesive agent with a hardening rate higher than that of the first adhesive agent to a portion formed by a surface of the LED base plate and the support member; and
   conducting a subsequent step after hardening of the second adhesive agent but before completion of hardening of the first adhesive agent when the LED base plate and the support member are secured together.

2. A method according to claim 1, wherein the second adhesive agent is applied to an area smaller than the area for applying the first adhesive agent.

3. A method according to claim 1, wherein the second adhesive agent is applied to one lateral surface of the base plate.

4. A method according to claim 3, wherein the second adhesive agent is applied to plural points on the lateral surface.

5. A method according to claim 1, wherein said step of applying the first adhesive agent includes a step of applying the first adhesive agent slenderly to the support member and a step of covering the first adhesive agent by the base plate.

6. A method according to claim 5, wherein the support member has a recess and the recess is filled with the first adhesive agent.

7. A method according to claim 1, wherein the second adhesive agent shows an elasticity after hardening lower than the elasticity of the first adhesive agent.

8. A method according to claim 1, wherein the first adhesive agent is a silicone adhesive agent.

9. A method according to claim 1, wherein the second adhesive agent is an ultraviolet ray setting type adhesive agent hardening by irradiation with ultraviolet rays, and further comprising the step of irradiating the ultraviolet ray setting type adhesive agent with ultraviolet rays before hardening of the first adhesive agent.

10. A method according to claim 1, further comprising the step of removing the second adhesive agent after hardening of the first adhesive agent.

* * * * *

UNITED STATES PATENT AND TRADEMARK OFFICE
CERTIFICATE OF CORRECTION

PATENT NO. : 6,461,883 B1
DATED : October 8, 2002
INVENTOR(S) : Ryuta Mine et al.

It is certified that error appears in the above-identified patent and that said Letters Patent is hereby corrected as shown below:

Column 4,
Line 8, "rises," should read -- rise, --.
Line 50, "and an" should read -- an --.

Signed and Sealed this

Sixth Day of May, 2003

JAMES E. ROGAN
*Director of the United States Patent and Trademark Office*